(12) United States Patent
Lin et al.

(10) Patent No.: US 11,043,958 B2
(45) Date of Patent: Jun. 22, 2021

(54) TIME-INTERLEAVED NOISE-SHAPING SUCCESSIVE-APPROXIMATION ANALOG-TO-DIGITAL CONVERTER

(71) Applicant: MEDIATEK INC., Hsinchu (TW)

(72) Inventors: Chin-Yu Lin, Hsinchu (TW); Ying-Zu Lin, Hsinchu (TW); Chih-Hou Tsai, Hsinchu (TW); Chao-Hsin Lu, Hsinchu (TW)

(73) Assignee: MEDIATEK INC., Hsinchu (TW)

( * ) Notice: Subject to any disclaimer, the term of this patent is extended or adjusted under 35 U.S.C. 154(b) by 0 days.

(21) Appl. No.: 16/990,016

(22) Filed: Aug. 11, 2020

(65) Prior Publication Data

US 2021/0119637 A1  Apr. 22, 2021

Related U.S. Application Data

(60) Provisional application No. 62/924,243, filed on Oct. 22, 2019.

(51) Int. Cl.
*H03M 1/38* (2006.01)
*H03M 1/08* (2006.01)
(Continued)

(52) U.S. Cl.
CPC ............. *H03M 1/38* (2013.01); *H03M 1/08* (2013.01); *H03M 1/1215* (2013.01);
(Continued)

(58) Field of Classification Search
CPC ............ H03M 1/38; H03M 1/14; H03M 1/08; H03M 1/1215; H03M 1/1245; H03M 1/802
See application file for complete search history.

(56) References Cited

U.S. PATENT DOCUMENTS 10,826,521 B1 * 11/2020 Huang ................. H03M 1/466
10,862,496 B1 * 12/2020 Neto .................... H03M 1/462
10,903,846 B1 *  1/2021 Liu ....................... H03M 1/66

OTHER PUBLICATIONS

Lin, Y.Z., et al.; "A 40MHz-BW 320MS/s Passive Noise-Shaping SAR ADC With Passive Signal-Residue Summation in 14nm FinFET;" 2019 IEEE International Solid-State Circuits Conference; Feb. 2019; pp. 329-332.

(Continued)

*Primary Examiner* — Brian K Young
(74) *Attorney, Agent, or Firm* — McClure, Qualey & Rodack, LLP

(57) ABSTRACT

A time-interleaved noise-shaping successive-approximation analog-to-digital converter (TI NS-SAR ADC) is shown. A first successive-approximation channel has a first set of successive-approximation registers, and a first coarse comparator operative to coarsely adjust the first set of successive-approximation registers. A second successive-approximation channel has a second set of successive-approximation registers, and a second coarse comparator operative to coarsely adjust the second set of successive-approximation registers. A fine comparator is provided to finely adjust the first set of successive-approximation registers and the second set of successive-approximation registers alternately. A noise-shaping circuit is provided to sample residues of the first and second successive-approximation channels for the fine comparator to finely adjust the first and second sets of successive-approximation registers.

20 Claims, 6 Drawing Sheets

(51) Int. Cl.
   *H03M 1/14*   (2006.01)
   *H03M 1/12*   (2006.01)
   *H03M 1/80*   (2006.01)

(52) U.S. Cl.
   CPC ........... *H03M 1/1245* (2013.01); *H03M 1/14* (2013.01); *H03M 1/802* (2013.01)

(56) References Cited

OTHER PUBLICATIONS

Extended European Search Report dated Feb. 18, 2021, issued in application No. EP 20194203.4.
Waters, A., et al.; "Highly time-interleaved noise-shaped SAR ADC with reconfigurable order;" IEEE; May 2016; pp. 1026-1029.

\* cited by examiner

TIME-INTERLEAVED NOISE-SHAPING SUCCESSIVE-APPROXIMATION ANALOG-TO-DIGITAL CONVERTER

CROSS REFERENCE TO RELATED APPLICATIONS

This application claims the benefit of U.S. Provisional Application No. 62/924,243, filed on Oct. 22, 2019, the entirety of which is incorporated by reference herein.

BACKGROUND OF THE INVENTION

Field of the Invention

The present invention relates to analog-to-digital converters (ADCs).

Description of the Related Art

Recently, the number of smart devices and the amount of data transfer are growing at an unprecedented rate. To provide users with a high-quality experience, wireless local area network (WLAN) plays a key role among wireless standards. Wifi 6 enhances spectrum efficiency, increases data rate, and serves more users simultaneously in public areas. To support 1024 Quadrature amplitude modulation (QAM) in a 160 MHz radio frequency (RF) signal bandwidth while retaining sufficient error vector magnitude (EVM), the ADC has to achieve in-band dynamic range (DR) of 63-70 dB over 80-MHz baseband bandwidth. Successive-approximation analog-to-digital converters (SAR ADCs) are used extensively in Wifi applications due to their low power and small footprint. For DR >60 dB, quantization noise and comparator noise become the dominant noise sources. Recently, noise-shaping (NS) SAR ADCs have become popular to increase signal-to-noise ratio (SNR), which considerably reduce these two noise sources.

A basic concept of SAR ADC is described in this paragraph. During an input sampling phase, an input voltage $V_I$ is sampled onto a weighted capacitor array (capacitive digital-to-analog converter, abbreviated to CDAC). During an analog-to-digital conversion phase, a successive-approximation scheme is performed. The CDAC is controlled to successively approximate its positive and negative output terminals. A comparator compares the positive and negative output terminals of the CDAC and, accordingly, successively adjusts a set of successive-approximation registers (e.g., a SAR logic). The values of the set of successive-approximation registers are fed back to the CDAC to control the successive-approximation between the positive and negative output terminals of the CDAC. According to a series of comparator outputs generated during the successive approximation, the capacitors within the CDAC are switched between several reference voltages to equalize the voltage levels at the positive and negative output terminals of the CDAC, and the digital representation of the input voltage $V_I$ is determined from the MSB (most significant bit) to the LSB (least significant bit) of the set of successive-approximation registers.

However, a residue voltage $V_R$ may still exist between the positive and negative output terminals of the CDAC after the successive approximation. A noise-shaping signal may be derived from the residue voltage $V_R$ for noise elimination. The comparator of the SAR ADC usually provides an additional differential input pair for subtraction of the noise-shaping signal. The additional differential input pair, however, may contribute extra thermal and kickback noise. Furthermore, the generation of the noise-shaping signal may involve an active residue amplification (using an op amp), which consumes a lot of power.

An efficient, low power, small area, high-speed, and wide bandwidth NS-SAR ADC is called for.

BRIEF SUMMARY OF THE INVENTION

A fully passive, time-interleaved (TI) noise-shaping successive-approximation analog-to-digital converter (NS-SAR ADC) is shown, which employs a passive (without an op amp) signal-residue summation technique and 2-way time-interleaving. The signal bandwidth is doubled while keeping the same dynamic range (DR) and figure-of-merit (FoM) versus a single-channel counterpart. A shared fine comparator reduces interleaving spurs.

A TI NS-SAR ADC in accordance with an exemplary embodiment of the present invention includes a first successive-approximation (SAR) channel, a second successive-approximation channel, a fine comparator, and a noise-shaping circuit. The first successive-approximation channel has a first set of successive-approximation registers (e.g. SAR logic), and a first coarse comparator operative to coarsely adjust the first set of successive-approximation registers. The second successive-approximation channel has a second set of successive-approximation registers (e.g. another SAR logic), and a second coarse comparator operative to coarsely adjust the second set of successive-approximation registers. The fine comparator is operative to finely adjust the first set of successive-approximation registers and the second set of successive-approximation registers alternately. The noise-shaping circuit samples residues of the first successive-approximation channel for the fine comparator to finely adjust the second set of successive-approximation registers, and samples residues of the second successive-approximation channel for the fine comparator to finely adjust the first set of successive-approximation registers.

In an exemplary embodiment, the noise-shaping circuit performs residue sampling using back-to-back capacitors, and integrates residues by charge sharing for signal-residue summation at the input side of the fine comparator.

In an exemplary embodiment, the first coarse comparator sets the first set of successive-approximation registers in a first phase, and the fine comparator sets the first set of successive-approximation registers in a second phase. The first phase is prior to the second phase.

In an exemplary embodiment, the second coarse comparator sets the second set of successive-approximation registers in the second phase, and the fine comparator sets the second set of successive-approximation registers in a third phase. The second phase is prior to the third phase.

In an exemplary embodiment, the first coarse comparator sets the first set of successive-approximation registers in the third phase, and the fine comparator sets the first set of successive-approximation registers in a fourth phase. The third phase is prior to the fourth phase.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description shows exemplary embodiments carrying out the invention. This description is made for the purpose of illustrating the general principles of the invention and should not be taken in a limiting sense. The scope of the invention is best determined by reference to the appended claims.

To enlarge the bandwidth and increase SNR, a time-interleaved noise-shaping successive-approximation analog-to-digital converter (TI NS-SAR ADC) is proposed. In an exemplary embodiment, a fully passive time-interleaved noise-shaping technique is introduced to enable a power-efficient ADC for wideband and low-noise data conversion.

Note that if two channels are interleaved without additional processing, the residues are not available at the beginning in each analog-to-digital conversion phase and noise shaping fails. In the proposed architecture, after the first few bit cycles of SAR conversion of one channel, a residue from another channel is available. As a result, each channel is able to complete the analog-to-digital conversion with the correct residue.

Figure 1:
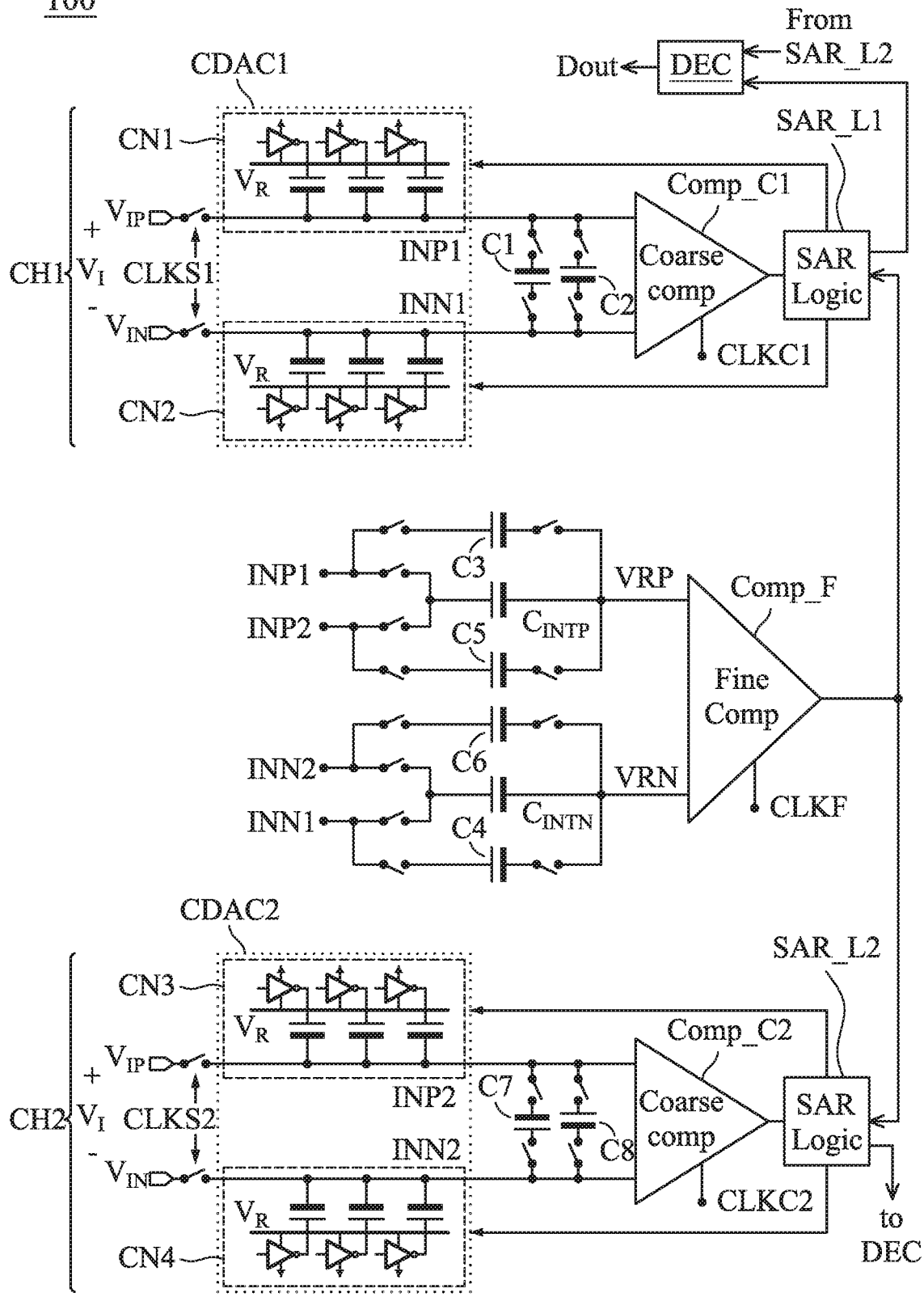
FIG. 1 depicts a time-interleaved noise-shaping successive-approximation analog-to-digital converter (TI NS-SAR ADC) 100 in accordance with an exemplary embodiment of the present invention.

FIG. 1 depicts a time-interleaved noise-shaping successive-approximation analog-to-digital converter (TI NS-SAR ADC) 100 in accordance with an exemplary embodiment of the present invention. The TI NS-SAR ADC 100 has a first successive-approximation channel CH1, a second successive-approximation channel CH2, a fine comparator Comp_F, a noise-shaping circuit (including the eight capacitors C1 to C8, a pair of integral capacitors Cm, and $C_{INTN}$, and the switches controlling the capacitors C1~C8, $C_{INTP}$, and $C_{INTN}$), and a decoder DEC. An input signal $V_I$ (referring to the differential inputs $V_{IP}$ and $V_{IN}$) of the TI NS-SAR 100 is sampled into the first successive-approximation channel CH1 and the second successive-approximation channel CH2 alternately, and the decoder DEC outputs digital representations DOUT of the input signal VI.

The first successive-approximation channel CH1 includes a first capacitive digital-to-analog converter (CDAC) CDAC1, a first coarse comparator Comp_C1, and a first set of successive-approximation registers (e.g., SAR logic) SAR_L1. The second successive-approximation channel CH2 includes a second capacitive digital-to-analog converter CDAC2, a second coarse comparator Comp_C2, and a second set of successive-approximation registers (e.g., another SAR logic) SAR_L2.

The first capacitive digital-to-analog converter CDAC1 has a first capacitor network CN1 whose top plate INP1 is coupled to a positive input terminal of the first coarse comparator Comp_C1 and a second capacitor network CN2 whose top plate INN1 is coupled to a negative input terminal of the first coarse comparator Comp_C1. In the input sampling phase of the first successive-approximation channel CH, the input signal $V_I$ of the TI NS-SAR ADC 100 is sampled between the top plate INP1 of the first capacitor network CN1 and the top plate INN1 of the second capacitor network CN2. The first coarse comparator Comp_C1 is operative to coarsely adjust the first set of successive-approximation registers SAR_L1. The noise-shaping circuit and the fine comparator Comp_F are responsible to the fine adjustments of the first set of successive-approximation registers SAR_L1. The values of the first set of successive-approximation registers SAR_L1 are fed back to control the first capacitive digital-to-analog converter CDAC1. A circuit loop is formed for the successive-approximation in the first successive-approximation channel CH1.

The second capacitive digital-to-analog converter CDAC2 has a third capacitor network CN3 whose top plate INP2 is coupled to a positive input terminal of the second coarse comparator Comp_C2 and a fourth capacitor network CN4 whose top plate INN2 is coupled to a negative input terminal of the first coarse comparator Comp_C2. In an input sampling phase of the second successive-approximation channel CH2, the input signal $V_I$ of the TI NS-SAR ADC 100 is sampled between the top plate INP2 of the third capacitor network CN3 and the top plate INN2 of the fourth capacitor network CN4. The second coarse comparator Comp_C2 is operative to coarsely adjust the second set of successive-approximation registers SAR_L2. The noise-shaping circuit and the fine comparator Comp_F are further responsible to the fine adjustments of the second set of successive-approximation registers SAR_L2. The values of the second set of successive-approximation registers SAR_L2 are fed back to control the second capacitive digital-to-analog converter CDAC2. A circuit loop is formed for the successive-approximation in the second successive-approximation channel CH2.

The first successive-approximation channel CH1 and the second successive-approximation channel CH2 operate in an interleaved way. Specifically, the fine comparator Comp_F is shared by the first successive-approximation channel CH1 and the second successive-approximation channel CH2 to finely adjust the first set of successive-approximation registers SAR_L1 and the second set of successive-approximation registers SAR_L2 alternately. Sharing the fine comparator Comp_F not only saves hardware but also converts overall channel offset into offset between the coarse and fine comparators (between Comp_C1 and Comp_F, or between Comp_C2 and Comp_F), preventing the analog-to-digital conversion from overloading and mitigating errors due to channel mismatch.

Note that the fine comparator Comp_F and the noise-shaping circuit perfectly eliminate residues. The coarse-fine architecture further solves the non-causality of inter-channel residue exchange. The noise-shaping circuit samples residues (between INP1 and INN1) of the first successive-approximation channel CH1 and, accordingly, the fine comparator Comp_F finely adjusts the second set of successive-approximation registers SAR_L2. The noise-shaping circuit further samples residues (between INP2 and INN2) of the second successive-approximation channel CH2 and, accordingly, the fine comparator Comp_F finely adjusts the first set of successive-approximation registers SAR_L1. The residues are ready when the fine comparator Comp_F operates. The fine comparator Comp_F operates based on reliable residue information.

For each round of the setting of the successive-approximation registers SAR_L1/SAR_L2, the coarse comparator Comp_C1/Comp_C2 resolves the initial bits at high speed, and then the low-noise fine comparator Comp_F resolves the lower bits and processes the signal-residue summation. Since the coarse comparisons (Comp_C1 and Comp_C2)

only work on the input signal without the residue (not ready), this arrangement allows another channel to have more time to finish the conversion and generate the residue. Once the residue is available and is charge shared for integration, the fine comparator Comp_f resolves the signal-residue summation to achieve noise shaping.

The noise-shaping circuit may perform residue sampling by back-to-back capacitors, and integrate residues by charge sharing, for signal-residue summation at an input side (referring to VRP and VRN) of the fine comparator Comp_F. The sampled residue is 2× larger than that that sampled by only one capacitor and no amplification is required. The residue is put in series with the capacitive digital-to-analog converter CDAC1/CDAC2 to realize summation.

The noise-shaping circuit may be a fully-passive design. In FIG. 1, the noise-shaping circuit has eight capacitors C1 to C8, a pair of integral capacitors $C_{INTP}$, and $C_{INTN}$, and the switches controlling the capacitors C1~C8, $C_{INTP}$, and $C_{INTN}$. As shown, the first integral capacitor $C_{INTP}$ has a top plate coupled to a positive input terminal VRP of the fine comparator Comp_F, and the second integral capacitor CINTN has a top plate coupled to a negative input terminal VRN of the fine comparator Comp_F. The first integral capacitor CINTP and the second integral capacitor CINTN are provided for integration of residues sampled from the first successive-approximation channel CH1 and the second successive-approximation channel CH2.

Figure 2:
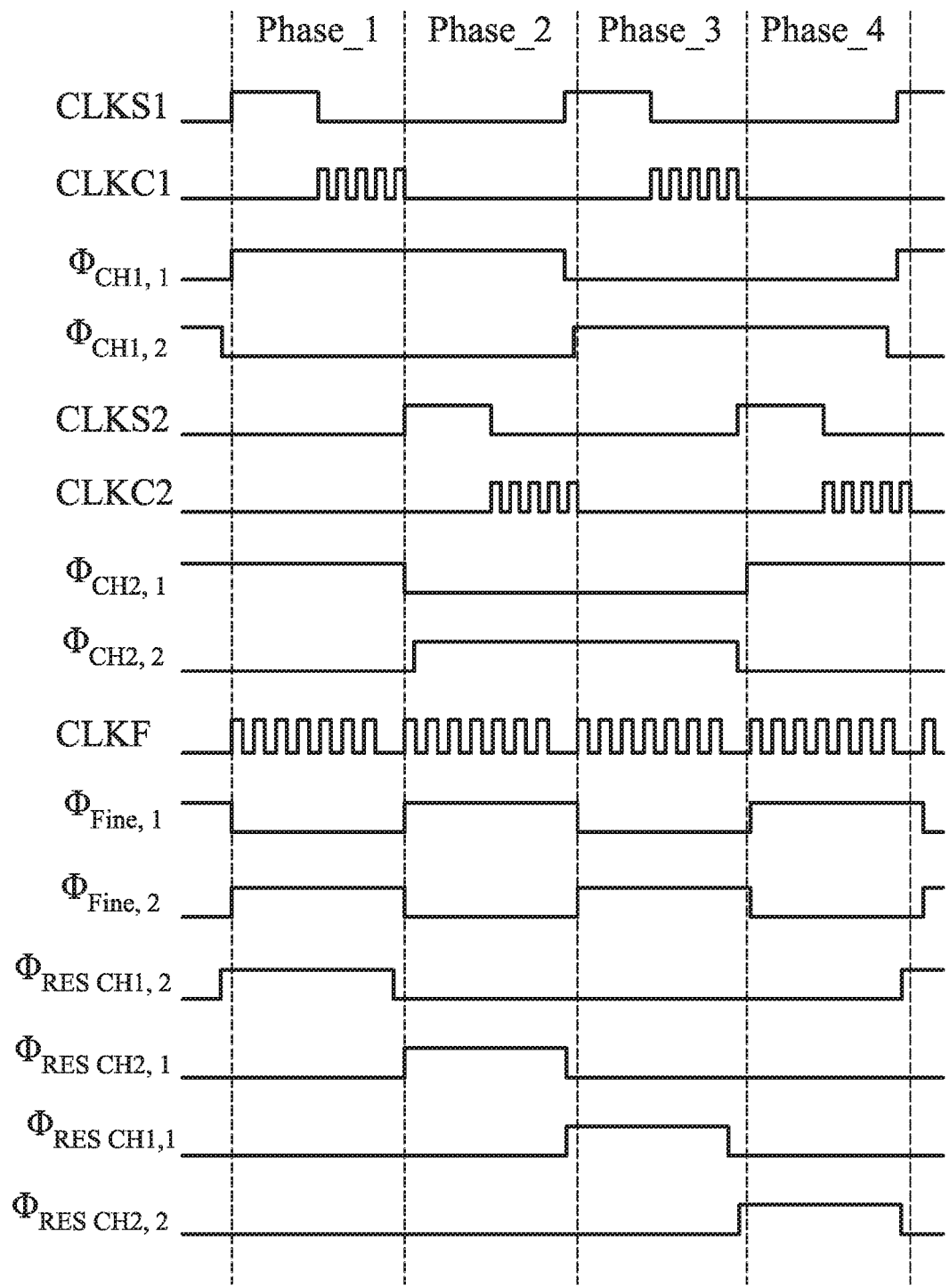
FIG. 2 is a timing scheme for operating the TI NS-SAR ADC 100, and how the noise-shaping circuit operates is shown.

FIG. 2 is a timing scheme for operating the TI NS-SAR ADC 100, and how the noise-shaping circuit operates is shown.

The waveforms shown in FIG. 2 are defined in this paragraph. CLKS1 is the sampling clock of the first successive-approximation channel CH1. CLKC1 is the coarse comparison clock controlling the first coarse comparator Comp_C1. $\Phi_{CH1,\,1}$ controls the first and second capacitors C1 and C2 to work as a pair of back-to-back capacitors for residue sampling of the first successive-approximation channel CH1. $\Phi_{CH1,\,2}$ controls the fifth and sixth capacitors C5 and C6 to work as a pair of back-to-back capacitors for residue sampling of the first successive-approximation channel CH1, interleaved with $\Phi_{CH1,\,1}$. CLKS2 is the sampling clock of the second successive-approximation channel CH2. CLKC2 is the coarse comparison clock signal controlling the second coarse comparator Comp_C2. $\Phi_{CH2,\,1}$ controls the seventh and eighth capacitors C7 and C8 to work as a pair of back-to-back capacitors for residue sampling of the second successive-approximation channel CH2. $\Phi_{CH2,\,2}$ controls the third and fourth capacitors C3 and C4 to work as a pair of back-to-back capacitors for residue sampling of the second successive-approximation channel CH2, interleaved with $\Phi_{CH,\,1}$. CLKF is the fine comparison clock controlling the fine comparator Comp_F. $\Phi_{Fine,\,1}$ is operative to connect the first capacitive digital-to-analog converter CDAC to the first and second integral capacitors $C_{INTP}$ and $C_{INTN}$ to form a SAR loop for the first successive-approximation channel CH1. $\Phi_{Fine,\,2}$ is operative to connect the second capacitive digital-to-analog converter CDAC2 to the first and second integral capacitors $C_{INTP}$ and $C_{INTN}$ to form a SAR loop for the second successive-approximation channel CH2. $\Phi_{RES\,CH1,\,2}$ controls the charge sharing between the first integral capacitor $C_{INTP}$ and the fifth capacitor C5, and controls the charge sharing between the second integral capacitor $C_{INTN}$ and the sixth capacitor C6. $\Phi_{RES\,CH2,\,1}$ controls the charge sharing between the first integral capacitor $C_{INTP}$ and the seventh capacitor C7, and controls the charge sharing between the second integral capacitor $C_{INTN}$ and the eighth capacitor C8. $\Phi_{RES\,CH1,\,1}$ controls the charge sharing between the first integral capacitor $C_{INTP}$ and the first capacitor C1, and controls the charge sharing between the second integral capacitor $C_{INTN}$ and the second capacitor C2. $\Phi_{RES\,CH2,\,2}$ controls the charge sharing between the first integral capacitor $C_{INTP}$ and the third capacitor C3, and controls the charge sharing between the second integral capacitor $C_{INTN}$ and the fourth capacitor C4. $\Phi_{RES\,CH1,\,2}$, $\Phi_{RES\,CH2,\,1}$, $\Phi_{RES\,CH1,\,1}$, and $\Phi_{RES\,CH2,\,2}$ are arranged to provide reliable residues to the signal-residue summation.

The TI NS-SAR ADC 100 operates in four phases Phase_1, Phase_2, Phase_3 and Phase_4. The first phase Phase_1 is prior to the second phase Phase_2, the second phase Phase_2 is prior to the third phase Phase_3, and the third phase Phase_3 is prior to the fourth phase Phase_4. The first coarse comparator Comp_C1 sets the first set of successive-approximation registers SAR_L1 in the first phase Phase_1 (referring to CLKC1) for the coarse adjustment of SAR_L1, and the fine comparator Comp_F sets the first set of successive-approximation registers SAR_L1 in the second phase Phase_2 (referring to CLKF and $\Phi_{Fine,\,1}$) for the fine adjustment of SAR_L1. The second coarse comparator Comp_C2 sets the second set of successive-approximation registers SAR_L2 in the second phase Phase_2 (referring to CLKC2) for the coarse adjustment of SAR_L2, and the fine comparator Comp_F sets the second set of successive-approximation registers SAR_L2 in the third phase Phase_3 (referring to CLKF and $\Phi_{Fine,\,2}$) for the fine adjustment of SAR_L2. The first coarse comparator Comp_C1 further sets the first set of successive-approximation registers SAR_L1 in the third phase Phase_3 (referring to CLKC1) for the coarse adjustment of SAR_L1, and the fine comparator Comp_F sets the first set of successive-approximation registers SAR_L1 in the fourth phase Phase_4 (referring to CLKF and $\Phi_{Fine,\,1}$) for the fine adjustment of SAR_L1.

At the end of the second phase Phase_2, an estimation of residue of the first successive-approximation channel CH1 is completed (due to the coarse adjustment for SAR_L1 in the first phase Phase_1 and the fine adjustment for SAR_L1 in the second phase Phase_2) and sampled by the first and second capacitors C1 and C2 (referring to $\Phi_{CH1,\,1}$). The following fine comparison for the second successive-approximation channel CH2 (referring to $\Phi_{Fine,\,2}$) in the third phase Phase_3, therefore, is based on the reliable residue value sampled in the first and second capacitors C1 and C2 (referring to $\Phi_{RES\,CH1,\,1}$). At the end of the third phase Phase_3, an estimation of residue of the second successive-approximation channel CH2 is completed (due to the coarse adjustment for SAR_L2 in the second phase Phase_2 and the fine adjustment for SAR_L2 in the third phase Phase_3) and sampled by the third and fourth capacitors C3 and C4 (referring to $\Phi_{CH2,\,2}$). The following fine comparison for the first successive-approximation channel CH1 (referring to $\Phi_{Fine,\,1}$) in the fourth phase Phase_4, therefore, is based on the reliable residue value sampled in the third and fourth capacitors C3 and C4 (referring to $\Phi_{RES\,CH2,\,2}$). Reliable residue elimination is achieved.

FIG. 2 further shows that the second coarse comparator Comp_C2 sets the second set of successive-approximation registers SAR_L2 in the fourth phase Phase_4 (referring to CLKC2), and the fine comparator Comp_F sets the second set of successive-approximation registers SAR_L2 in the first phase Phase_1 (referring to CLK_F and $\Phi_{Fine,\,2}$). A time-interleaved scheme is completed by the four phases Phase_1~Phase_4.

FIGS. 3A, 3B, 3C and 3D show the detailed connections of the noise-shaping circuit in the four different phases Phase_1 to Phase_4.

Figure 3A:
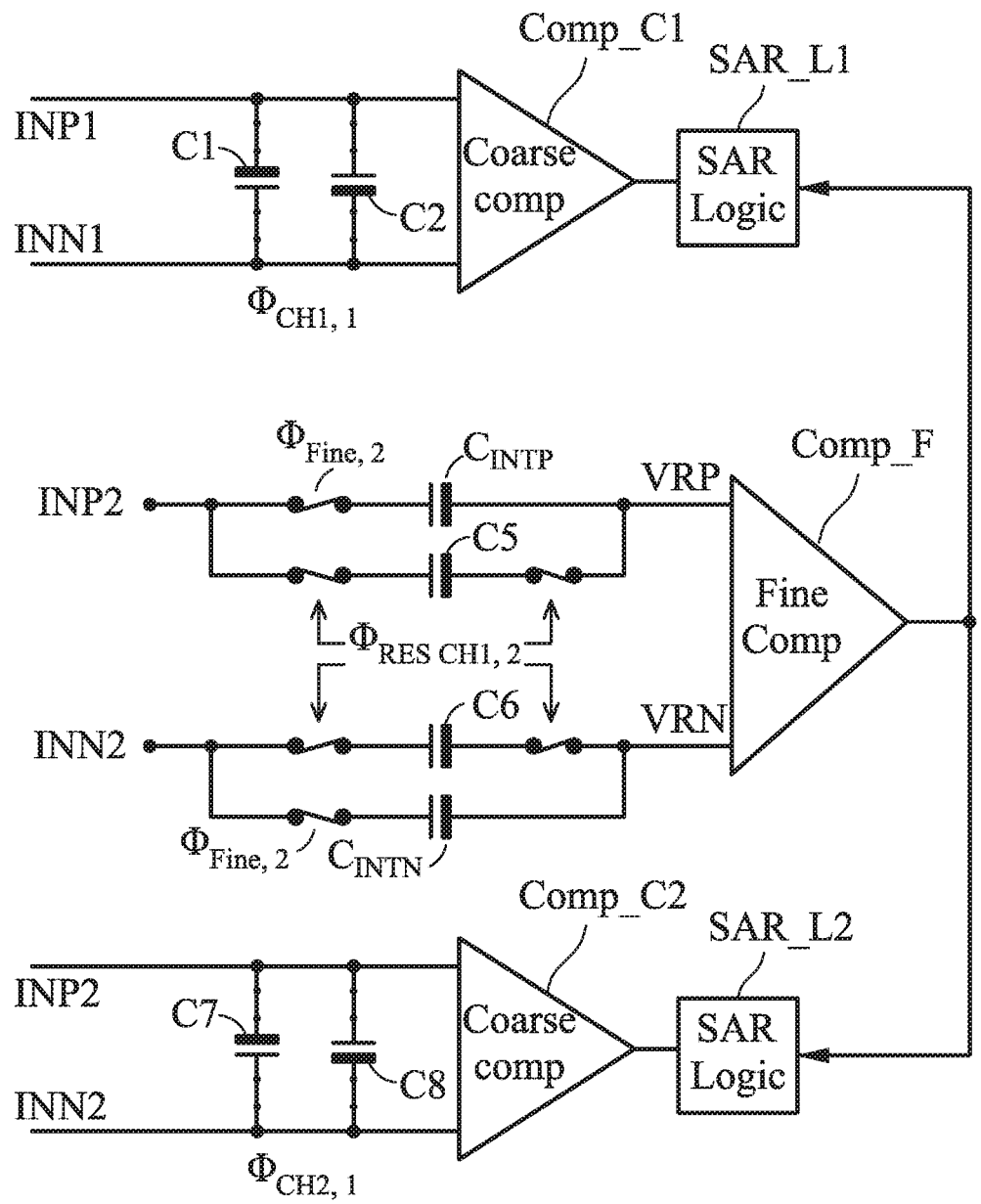
FIGS. 3A, 3B, 3C and 3D show the detailed connections of the noise-shaping circuit in the four different phases Phase_1 to Phase_4.

FIG. 3A corresponds to the first phase Phase_1. The top plate INP1 of the first capacitor network CN1 is coupled to the top plate of the first capacitor C1 and the bottom plate of the second capacitor C2, and the top plate INN1 of the second capacitor network CN2 is coupled to the bottom plate of the first capacitor C1 and the top plate of the second capacitor C2. The fifth capacitor C5 and the first integral capacitor $C_{INTP}$ are coupled in parallel between the positive input terminal VRP of the fine comparator Comp_F and the top plate INP2 of the third capacitor network CN3, and the sixth capacitor C6 and the second integral capacitor $C_{INTN}$ are coupled in parallel between the negative input terminal VRN of the fine comparator Comp_F and the top plate INN2 of the fourth capacitor network CN4. The top plate INP2 of the third capacitor network CN3 is coupled to the top plate of the seventh capacitor C7 and the bottom plate of the eighth capacitor C8, and the top plate INN2 of the fourth capacitor network CN4 is coupled to the bottom plate of the seventh capacitor C7 and the top plate of the eighth capacitor C8.

In the first phase Phase_1, the fine comparator Comp_F sets the second set of successive-approximation registers SAR_L2 based on the reliable residue sampled from the first successive-approximation channel CH, and the first coarse comparator Comp_C1 sets the first set of successive-approximation registers SAR_L1.

Figure 3B:
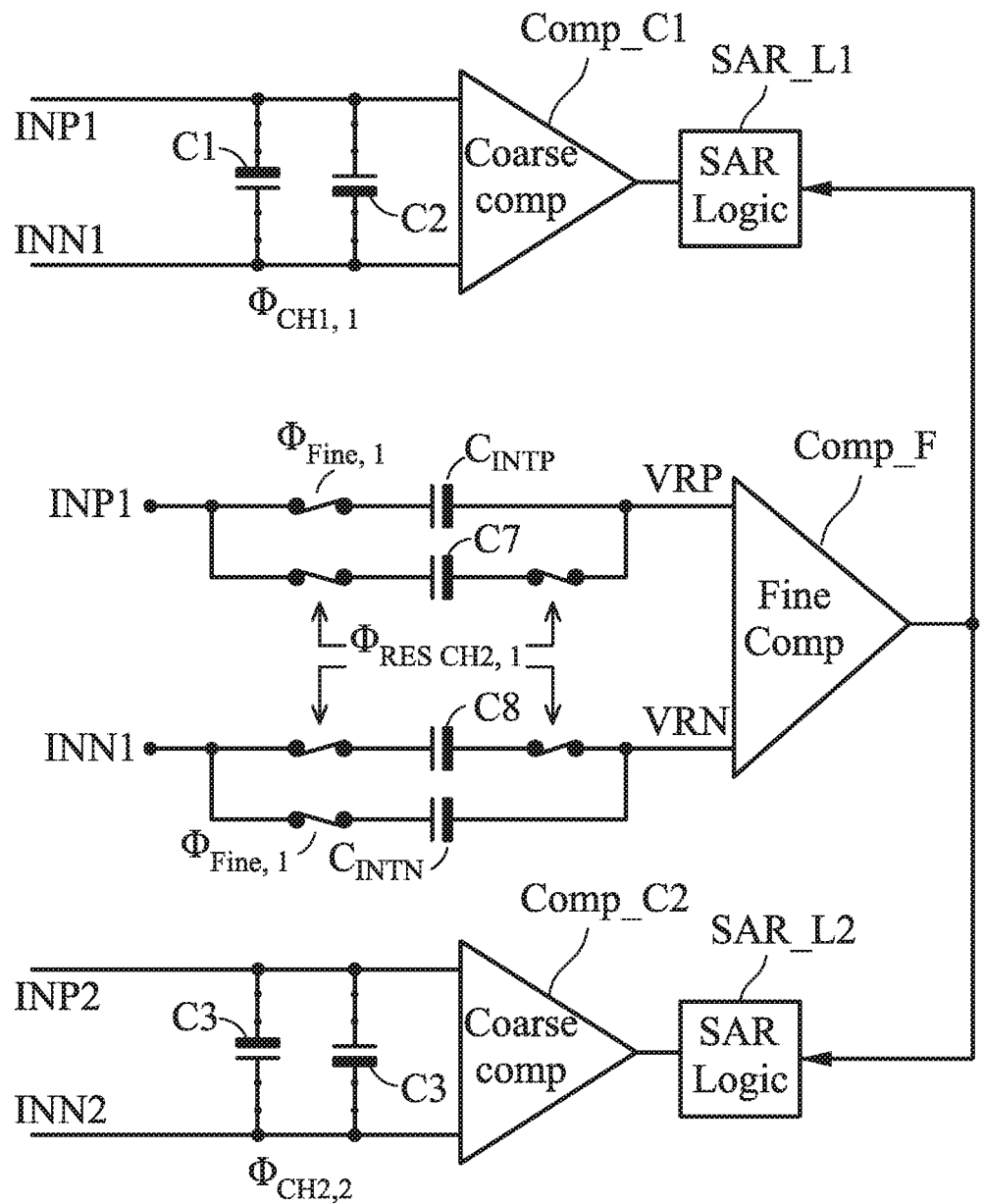

FIG. 3B corresponds to the second phase Phase_2. The top plate INP1 of the first capacitor network CN1 is coupled to the top plate of the first capacitor C1 and the bottom plate of the second capacitor C2, and the top plate INN1 of the second capacitor network CN2 is coupled to the bottom plate of the first capacitor C1 and the top plate of the second capacitor C2. The seventh capacitor C7 and the first integral capacitor $C_{INTP}$ are coupled in parallel between the positive input terminal VRP of the fine comparator Comp_F and the top plate INP1 of the first capacitor network CN1, and the eighth capacitor C8 and the second integral capacitor $C_{INTN}$ are coupled in parallel between the negative input terminal VRN of the fine comparator Comp_F and the top plate INN1 of the second capacitor network CN2. The top plate INP2 of the third capacitor network CN3 is coupled to the top plate of the third capacitor C3 and the bottom plate of the fourth capacitor C4, and the top plate INN2 of the fourth capacitor network CN4 is coupled to the bottom plate of the third capacitor C3 and the top plate of the fourth capacitor C4.

In the second phase Phase_2, the fine comparator Comp_F sets the first set of successive-approximation registers SAR_L1 based on the reliable residue sampled from the second successive-approximation channel CH2, and the second coarse comparator Comp_C2 sets the second set of successive-approximation registers SAR_L2.

Figure 3C:
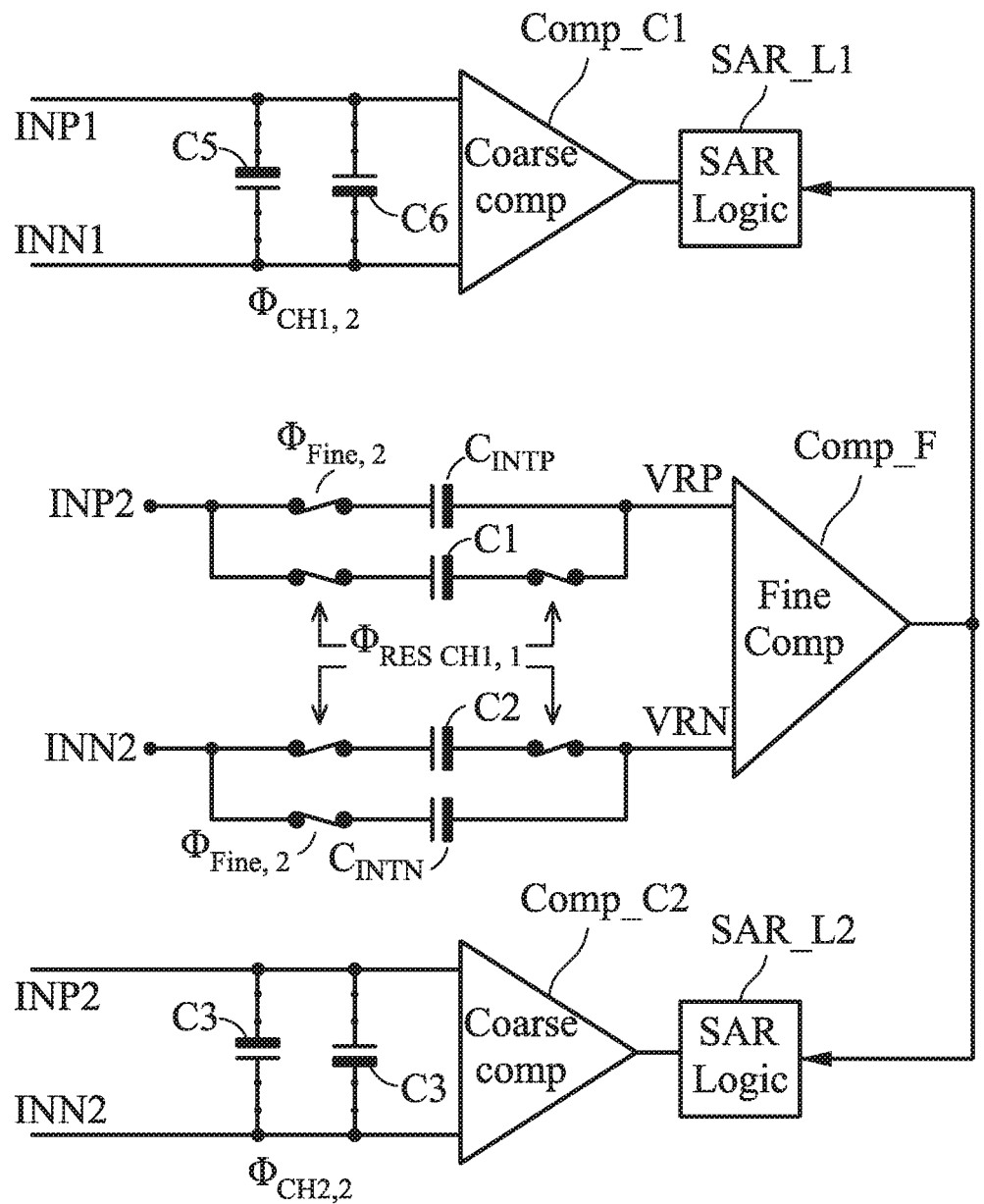

FIG. 3C corresponds to the third phase Phase_3. The top plate INP1 of the first capacitor network CN1 is coupled to the top plate of the fifth capacitor C5 and the bottom plate of the sixth capacitor C6, and the top plate INN1 of the second capacitor network CN2 is coupled to the bottom plate of the fifth capacitor C5 and the top plate of the sixth capacitor C6. The first capacitor C1 and the first integral capacitor $C_{INTP}$ are coupled in parallel between the positive input terminal VRP of the fine comparator Comp_F and the top plate INP2 of the third capacitor network CN3, and the second capacitor C2 and the second integral capacitor $C_{INTN}$ are coupled in parallel between the negative input terminal VRN of the fine comparator Comp_F and the top plate INN2 of the fourth capacitor network CN4. The top plate INP2 of the third capacitor network CN3 is coupled to the top plate of the third capacitor C3 and the bottom plate of the fourth capacitor C4, and the top plate INN2 of the fourth capacitor network CN4 is coupled to the bottom plate of the third capacitor C3 and the top plate of the fourth capacitor C4.

In the third phase Phase_3, the fine comparator Comp_F sets the second set of successive-approximation registers SAR_L2 based on the reliable residue sampled from the first successive-approximation channel CH, and the first coarse comparator Comp_C1 sets the first set of successive-approximation registers SAR_L1.

Figure 3D:
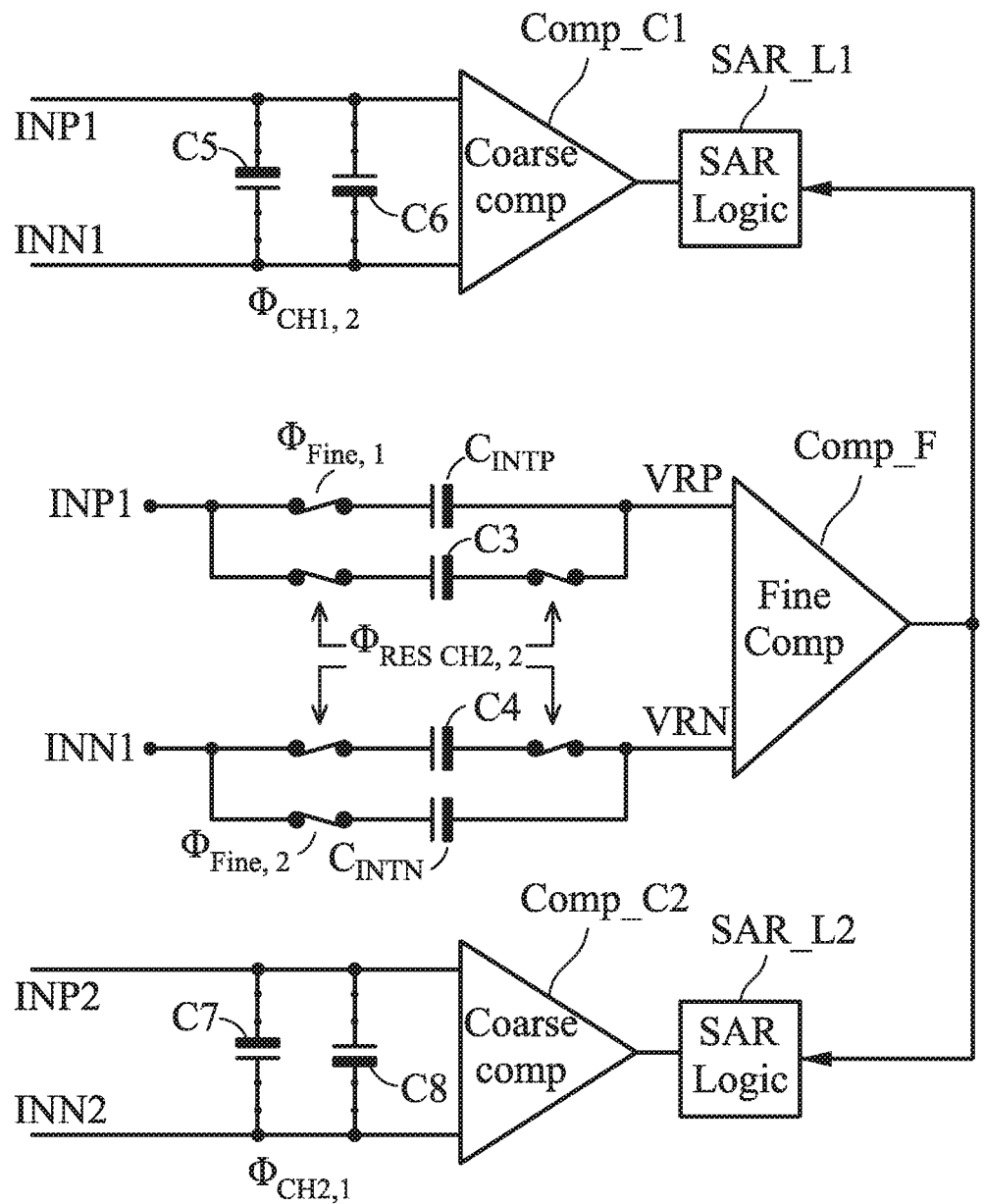

FIG. 3D corresponds to the fourth phase Phase_4. The top plate INP1 of the first capacitor network CN1 is coupled to the top plate of the fifth capacitor C5 and the bottom plate of the sixth capacitor C6, and the top plate INN1 of the second capacitor network CN2 is coupled to the bottom plate of the fifth capacitor C5 and the top plate of the sixth capacitor C6. The third capacitor C3 and the first integral capacitor $C_{INTP}$ are coupled in parallel between the positive input terminal VRP of the fine comparator Comp_F and the top plate INP1 of the first capacitor network CN1, and the fourth capacitor C4 and the second integral capacitor $C_{INTN}$ are coupled in parallel between the negative input terminal VRN of the fine comparator Comp_F and the top plate INN1 of the second capacitor network CN2. The top plate INP2 of the third capacitor network CN3 is coupled to the top plate of the seventh capacitor C7 and the bottom plate of the eighth capacitor C8, and the top plate INN2 of the fourth capacitor network CN4 is coupled to the bottom plate of the seventh capacitor C7 and the top plate of the eighth capacitor C8.

In the fourth phase Phase_4, the fine comparator Comp_F sets the first set of successive-approximation registers SAR_L1 based on the reliable residue sampled from the second successive-approximation channel CH2, and the second coarse comparator Comp_C2 sets the second set of successive-approximation registers SAR_L2.

The aforementioned TI NS-SAR ADC 100 effectively improves the dynamic range (DR) and doubles the bandwidth compared to a conventional single channel SAR ADC. The layout size is limited due to the shared fine comparator. Specifically, no multiple-input-pair comparators and amplifiers are required. Hence, the proposed architecture is able to deliver wide bandwidth with sufficient DR for Wifi 6 while delivering excellent power efficiency.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A time-interleaved noise-shaping successive-approximation analog-to-digital converter, comprising:
   a first successive-approximation channel, having a first set of successive-approximation registers and a first coarse comparator coupled to the first set of successive-approximation registers to coarsely adjust the first set of successive-approximation registers;
   a second successive-approximation channel, having a second set of successive-approximation registers and a second coarse comparator coupled to the second set of successive-approximation registers to coarsely adjust the second set of successive-approximation registers;
   a fine comparator, coupled to the first set of successive-approximation registers and the second set of successive-approximation registers, to finely adjust the first set of successive-approximation registers and the second set of successive-approximation registers alternately; and a noise-shaping circuit, sampling residues of the first successive-approximation channel for the fine comparator to finely adjust the second set of successive-approximation registers, and sampling residues of the second successive-approximation channel for the fine comparator to finely adjust the first set of successive-approximation registers.

2. The time-interleaved noise-shaping successive-approximation analog-to-digital converter as claimed in claim 1, wherein:
the noise-shaping circuit performs residue sampling using back-to-back capacitors; and
the noise-shaping circuit integrates residues by charge sharing, for signal-residue summation at an input side of the fine comparator.

3. The time-interleaved noise-shaping successive-approximation analog-to-digital converter as claimed in claim 1, wherein:
the first coarse comparator sets the first set of successive-approximation registers in a first phase;
the fine comparator sets the first set of successive-approximation registers in a second phase; and
the first phase is prior to the second phase.

4. The time-interleaved noise-shaping successive-approximation analog-to-digital converter as claimed in claim 3, wherein:
the second coarse comparator sets the second set of successive-approximation registers in the second phase;
the fine comparator sets the second set of successive-approximation registers in a third phase; and
the second phase is prior to the third phase.

5. The time-interleaved noise-shaping successive-approximation analog-to-digital converter as claimed in claim 4, wherein:
the first coarse comparator sets the first set of successive-approximation registers in the third phase;
the fine comparator sets the first set of successive-approximation registers in a fourth phase; and
the third phase is prior to the fourth phase.

6. The time-interleaved noise-shaping successive-approximation analog-to-digital converter as claimed in claim 5, wherein:
the second coarse comparator sets the second set of successive-approximation registers in the fourth phase.

7. The time-interleaved noise-shaping successive-approximation analog-to-digital converter as claimed in claim 6, wherein:
the fine comparator sets the second set of successive-approximation registers in the first phase.

8. The time-interleaved noise-shaping successive-approximation analog-to-digital converter as claimed in claim 1, wherein the noise-shaping circuit further comprises:
a first integral capacitor whose top plate is coupled to a positive input terminal of the fine comparator; and
a second integral capacitor whose top plate is coupled to a negative input terminal of the fine comparator,
wherein the first integral capacitor and the second integral capacitor are provided for integration of residues sampled from the first successive-approximation channel and the second successive-approximation channel.

9. The time-interleaved noise-shaping successive-approximation analog-to-digital converter as claimed in claim 8, wherein
the first successive-approximation channel further has a first capacitive digital-to-analog converter operated according to the first set of successive-approximation registers, wherein the first capacitive digital-to-analog converter has a first capacitor network whose top plate is coupled to a positive input terminal of the first coarse comparator and a second capacitor network whose top plate is coupled to a negative input terminal of the first coarse comparator;
the second successive-approximation channel further has a second capacitive digital-to-analog converter operated according to the second set of successive-approximation registers, wherein the second capacitive digital-to-analog converter has a third capacitor network whose top plate is coupled to a positive input terminal of the second coarse comparator and a fourth capacitor network whose top plate is coupled to a negative input terminal of the second coarse comparator;
in an input sampling phase of the first successive-approximation channel, an input signal of the time-interleaved noise-shaping successive-approximation analog-to-digital converter is sampled between the top plate of the first capacitor network and the top plate of the second capacitor network; and
in an input sampling phase of the second successive-approximation channel, the input signal of the time-interleaved noise-shaping successive-approximation analog-to-digital converter is sampled between the top plate of the third capacitor network and the top plate of the fourth capacitor network.

10. The time-interleaved noise-shaping successive-approximation analog-to-digital converter as claimed in claim 9, wherein the noise-shaping circuit further comprises a first capacitor and a second capacitor, wherein:
in a first phase and a second phase, the top plate of the first capacitor network is coupled to a top plate of the first capacitor and a bottom plate of the second capacitor, and the top plate of the second capacitor network is coupled to a bottom plate of the first capacitor and a top plate of the second capacitor;
in a third phase, the first capacitor and the first integral capacitor are coupled in parallel between the positive input terminal of the fine comparator and the top plate of the third capacitor network, and the second capacitor and the second integral capacitor are coupled in parallel between the negative input terminal of the fine comparator and the top plate of the fourth capacitor network; and
the first phase is prior to the second phase, and the second phase is prior to the third phase.

11. The time-interleaved noise-shaping successive-approximation analog-to-digital converter as claimed in claim 10, wherein the noise-shaping circuit further comprises a third capacitor and a fourth capacitor, wherein:
in the second phase and the third phase, the top plate of the third capacitor network is coupled to a top plate of the third capacitor and a bottom plate of the fourth capacitor, and the top plate of the fourth capacitor network is coupled to a bottom plate of the third capacitor and a top plate of the fourth capacitor;
in a fourth phase, the third capacitor and the first integral capacitor are coupled in parallel between the positive input terminal of the fine comparator and the top plate of the first capacitor network, and the fourth capacitor and the second integral capacitor are coupled in parallel between the negative input terminal of the fine comparator and the top plate of the second capacitor network; and the third phase is prior to the fourth phase.

12. The time-interleaved noise-shaping successive-approximation analog-to-digital converter as claimed in claim 11, wherein the noise-shaping circuit further comprises a fifth capacitor and a sixth capacitor, wherein:

in the first phase, the fifth capacitor and the first integral capacitor are coupled in parallel between the positive input terminal of the fine comparator and the top plate of the third capacitor network, and the sixth capacitor and the second integral capacitor are coupled in parallel between the negative input terminal of the fine comparator and the top plate of the fourth capacitor network.

13. The time-interleaved noise-shaping successive-approximation analog-to-digital converter as claimed in claim 12, wherein the noise-shaping circuit further comprises a seventh capacitor and an eighth capacitor, wherein:

in the second phase, the seventh capacitor and the first integral capacitor are coupled in parallel between the positive input terminal of the fine comparator and the top plate of the first capacitor network, and the eighth capacitor and the second integral capacitor are coupled in parallel between the negative input terminal of the fine comparator and the top plate of the second capacitor network.

14. The time-interleaved noise-shaping successive-approximation analog-to-digital converter as claimed in claim 13, wherein:

in the third phase and the fourth phase, the top plate of the first capacitor network is coupled to a top plate of the fifth capacitor and a bottom plate of the sixth capacitor, and the top plate of the second capacitor network is coupled to a bottom plate of the fifth capacitor and a top plate of the sixth capacitor.

15. The time-interleaved noise-shaping successive-approximation analog-to-digital converter as claimed in claim 14, wherein:

in the first phase and the fourth phase, the top plate of the third capacitor network is coupled to a top plate of the seventh capacitor and a bottom plate of the eighth capacitor, and the top plate of the fourth capacitor network is coupled to a bottom plate of the seventh capacitor and a top plate of the eighth capacitor.

16. The time-interleaved noise-shaping successive-approximation analog-to-digital converter as claimed in claim 15, wherein:

the first coarse comparator sets the first set of successive-approximation registers in the first phase; and the fine comparator sets the first set of successive-approximation registers in the second phase.

17. The time-interleaved noise-shaping successive-approximation analog-to-digital converter as claimed in claim 16, wherein:

the second coarse comparator sets the second set of successive-approximation registers in the second phase; and the fine comparator sets the second set of successive-approximation registers in the third phase.

18. The time-interleaved noise-shaping successive-approximation analog-to-digital converter as claimed in claim 17, wherein:

the first coarse comparator sets the first set of successive-approximation registers in the third phase; and the fine comparator sets the first set of successive-approximation registers in the fourth phase.

19. The time-interleaved noise-shaping successive-approximation analog-to-digital converter as claimed in claim 18, wherein:

the second coarse comparator sets the second set of successive-approximation registers in the fourth phase.

20. The time-interleaved noise-shaping successive-approximation analog-to-digital converter as claimed in claim 19, wherein:

the fine comparator sets the second set of successive-approximation registers in the first phase.

* * * * *